US007558105B2

United States Patent
Suh

(10) Patent No.: US 7,558,105 B2
(45) Date of Patent: Jul. 7, 2009

(54) PHASE CHANGE MEMORY DEVICES AND MULTI-BIT OPERATING METHODS FOR THE SAME

(75) Inventor: Dong-Seok Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 348 days.

(21) Appl. No.: 11/505,362

(22) Filed: Aug. 17, 2006

(65) Prior Publication Data

US 2007/0153570 A1    Jul. 5, 2007

(30) Foreign Application Priority Data

Jan. 5, 2006    (KR)    ...................... 10-2006-0001391

(51) Int. Cl.
  *G11C 11/00*    (2006.01)
(52) U.S. Cl. ...................................................... 365/163
(58) Field of Classification Search ................. 365/163, 365/189.01
See application file for complete search history.

(56) References Cited

U.S. PATENT DOCUMENTS

2006/0067097 A1*   3/2006   Lien et al. ..................... 365/49
2006/0126380 A1*   6/2006   Osada et al. ................. 365/163

FOREIGN PATENT DOCUMENTS

WO   WO 2003/058633   7/2003
WO   WO 2005/031752   4/2005

* cited by examiner

*Primary Examiner*—Son Dinh
(74) *Attorney, Agent, or Firm*—Harness, Dickey & Pierce, P.L.C.

(57) ABSTRACT

A phase change memory device includes a phase change resistor and first and second electrodes. The first and second electrodes may be connected to opposite ends of the phase change resistor, respectively. In a programming operation, the resistance of the phase change resistor is changed to at least one of a plurality of stages by an electric signal applied in a direction from the first electrode to the second electrode and an electric signal applied in a direction from the second electrode to the first electrode. In a reading operation, the programmed resistance of the phase change resistor is read by applying an electric signal between the first electrode and the second electrode in an arbitrary direction.

20 Claims, 5 Drawing Sheets

PHASE CHANGE MEMORY DEVICES AND MULTI-BIT OPERATING METHODS FOR THE SAME

PRIORITY STATEMENT

This non-provisional U.S. patent application claims priority under 35 U.S.C. § 119 to Korean Patent Application No. 10-2006-0001391, filed on Jan. 5, 2006, in the Korean Intellectual Property Office (KIPO), the entire contents of which are incorporated herein in its entirety by reference.

BACKGROUND

A related art non-volatile phase change memory device may utilize a phase change resistor with a variable resistance as a storage node. The resistance of the phase change resistor may vary depending on the crystalline state of the phase change resistor. For example, the resistance of the phase change resistor in a crystalline state may be lower, while the resistance of the phase change resistor in an amorphous state may be higher. A related art phase change memory device may use the phase change resistor to process 1-bit data. However, relatively higher heat treatment may be needed to change the phase change resistor from a crystalline state to an amorphous state, and thus, a relatively larger current or voltage need be applied to the phase change resistor.

The relatively higher operating current and/or voltage may limit the higher integration of phase change memory devices. For example, the higher operating current and/or voltage may induce a short channel effect for an access transistor controlling the phase change resistor, which may limit integration of the access transistor. In addition, integration of the phase change memory device may be limited by problems in manufacturing processes thereof, for example, etching damage in the phase change resistor and/or irregular formation of electrodes connected to the phase change resistor.

The related art discloses a multi-bit programming method for a phase change memory device in which the number of electric pulses applied to a phase change resistor is controlled. The resistance of the phase change resistor varies according to the number of applied electric pulses.

Other related art discloses a multi level cell (MLC) programming method in which the fall time of a current signal applied to a phase change resistor may be set to program the phase change resistor in one of a plurality of states. However, in related art programming methods, such as, the multi-bit programming method and the MLC programming method, the programming level may be increasingly difficult to controlled, and thus, related art programming methods may be less reliable and/or more difficult to commercialize.

SUMMARY

Example embodiments of the present invention relate to semiconductor memory devices, for example, phase change memory devices and multi-bit operating methods for the same. At least some example embodiments provide multi-bit operating methods for phase change memory devices providing increased reliability and/or commercial use. An example phase change memory device may include a phase change resistor and first and second electrodes respectively connected to opposite ends of a phase change resistor.

According to at least one example embodiment, a multi-bit operation method for a phase change memory device may include a programming operation and a reading operation. In the programming operation, the phase change memory device may be programmed by changing the resistance of the phase change resistor to at least one of four stages by applying an electric signal from the first electrode to the second electrode and applying an electric signal from the second electrode to the first electrode. In the reading operation, the programmed resistance of the phase change resistor may be read by applying an electric signal between the first electrode and the second electrode in an arbitrary direction.

In at least one other example embodiment, a phase change memory device may include a phase change resistor having a variable resistance. The phase change resistor may be formed between a first electrode and a second electrode. The phase change memory device may be configured to be programmed by setting the variable resistance to one of a plurality of states by varying a direction in which an electric signal flows through the phase change resistor.

In at least one other example embodiment, a method for operating a phase change memory device including a phase change resistor may include programming the phase change memory device by changing a resistance of the phase change resistor to one of a plurality of states by varying a direction in which an electric signal flows through the phase change resistor.

According to at least some example embodiments of the present invention, the programming operation may include applying an electric signal from the first electrode to the second electrode so that the resistance of the phase change resistor may be changed to a first set state or a first reset state and applying an electric signal from the second electrode to the first electrode direction so that the resistance of the phase change resistor may be changed to a second set state or a second reset state. The electric signal may be applied from the first electrode to the second electrode and the electric signal applied from the second electrode to the first electrode may have opposite polarities. The contact area of the first electrode with the phase change resistor may be larger than the contact area of the second electrode with the phase change resistor. The resistance of the phase change resistor in the first set state may be lower than in the second set state, the resistance in the second set state lower than the resistance in a first reset state, and the resistance in the first reset state may be lower than the resistant in a second reset state.

BRIEF DESCRIPTION OF THE DRAWINGS

The present invention will become more apparent by describing in detail the example embodiments shown in the attached drawings in which.

DETAILED DESCRIPTION OF EXAMPLE EMBODIMENTS

Figure 1:
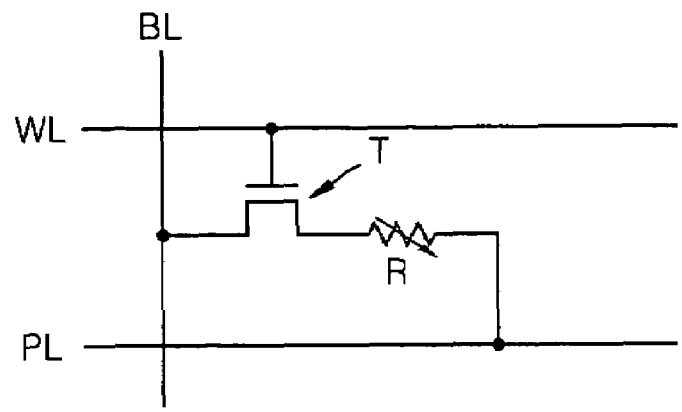
FIG. 1 illustrates a circuit diagram of a phase change memory device according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

In order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed there between. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Hereinafter, the present invention will be described in detail by explaining example embodiments of the invention with reference to the attached drawings, wherein like reference numerals refer to the like elements throughout. Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

FIG. 1 is a circuit diagram of a phase change memory device, according to an example embodiment of the present invention.

Referring to FIG. 1, a phase change memory device, according to an example embodiment of the present invention, may include an access transistor T and a phase change resistor R. A first end of the phase change resistor R may be connected to a bit line BL via the access transistor T. The gate of the access transistor T may be connected to a word line WL. An electric signal may be applied from the bit line BL to the phase change resistor R by controlling a voltage applied to the word line WL. A second end of the phase change resistor R may be connected to a plate line PL.

The crystalline state of the phase change resistor R may be changed based on electric signals applied between bit line BL and plate line PL, and the phase change resistor R may have different resistances based on the crystalline state of the phase change resistor. In at least one example embodiment, an electric signal applied to the phase change resistor R may flow from the bit line BL to the plate line PL or vice versa. In another example, the plate line PL may be grounded, the electric signal may be applied to the bit line BL, and the polarity of the electric signal may be changed, for example, alternately.

Figure 2:
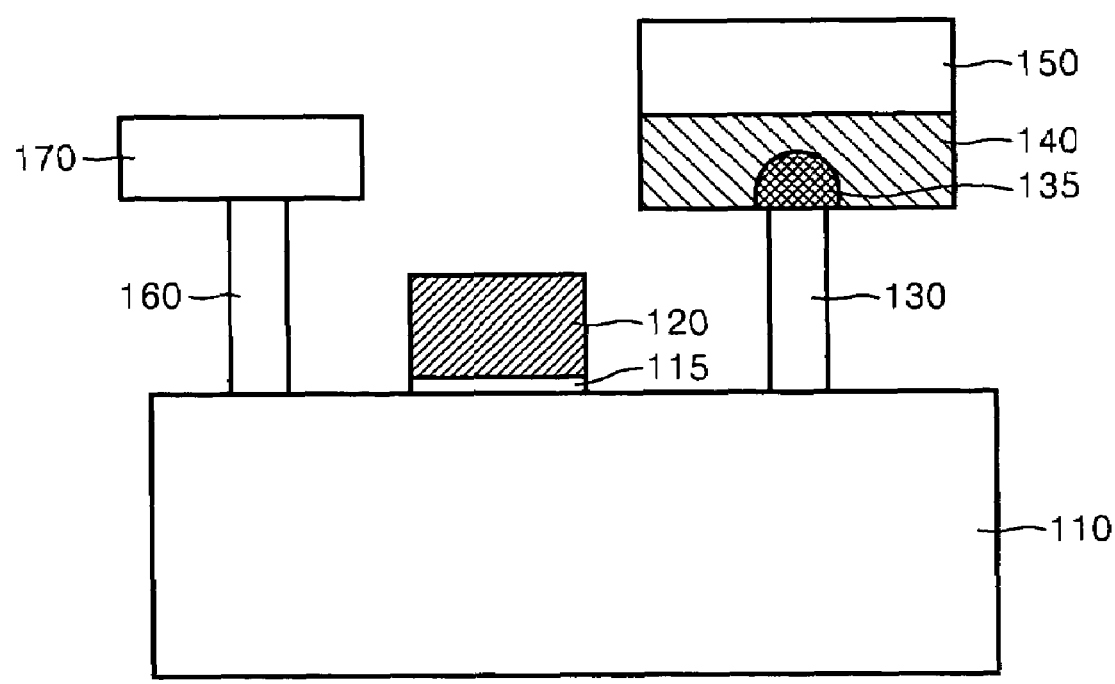
FIG. 2 illustrates a cross-sectional view of a phase change memory device according to another example embodiment of the present invention.

FIG. 2 is a cross-sectional view of a phase change memory device, according to an example embodiment of the present invention. Referring to FIG. 2, a gate insulating layer 115 may be formed on a semiconductor substrate 110 and a gate electrode 120 may be formed on the gate insulating layer 115. A first end of a lower electrode 130 may be connected to a first portion of the semiconductor substrate 110, and a second end of the lower electrode 130 may be connected to a lower surface of a phase change resistor 140. An upper surface of the phase change resistor 140 may be connected to an upper electrode 150. A bit line electrode 170 may be connected to a conductive plug 160. The conductive plug 160 may be connected to a second portion of the semiconductor substrate 110. The first and second portions of the semiconductor substrate 110 may be a source region and a drain region, respectively. Alternatively, the first and second portioris of the semiconductor substrate 110 may be a drain and a source region, respectively.

In an example embodiment, the upper and lower electrodes 150 and 130 may have, for example, different structures and/or different sizes. Accordingly, areas of the phase change resistor 140 contacting the upper electrode 150 and the lower electrode 130 may be different. As shown in FIG. 2, for example, the upper electrode 150 may cover the upper surface of the phase change resistor 140, and the lower electrode 130 may cover at least a portion of the lower surface of the phase change resistor 140. In at least one example embodiment, the contact area of the phase change resistor 140 contacting the upper electrode 150 may be larger than the contact area of the phase change resistor 140 contacting the lower electrode 130. The phase change resistor 140 may further include a phase change region 135. The phase change region 135 may be a portion of the phase change resistor 140 at which a current may be concentrated. As shown in FIG. 2, for example, at least a portion of the phase change region 135 may be an area at which the lower electrode 130 contacts the phase change resistor 140.

The upper and lower electrodes 150 and 130 may include conductive materials, for example, metal films, metal nitride films combinations thereof, or any other material with similar or substantially similar conductive properties. The upper and lower electrodes 150 and 130, which may be formed of conductive materials and may be connected to opposite ends of the phase change resistor 140, may have various names in the field. For example, the upper electrode 150 may be referred to as a plate electrode and the lower electrode 130 may be referred to as a contact plug.

Figure 3:
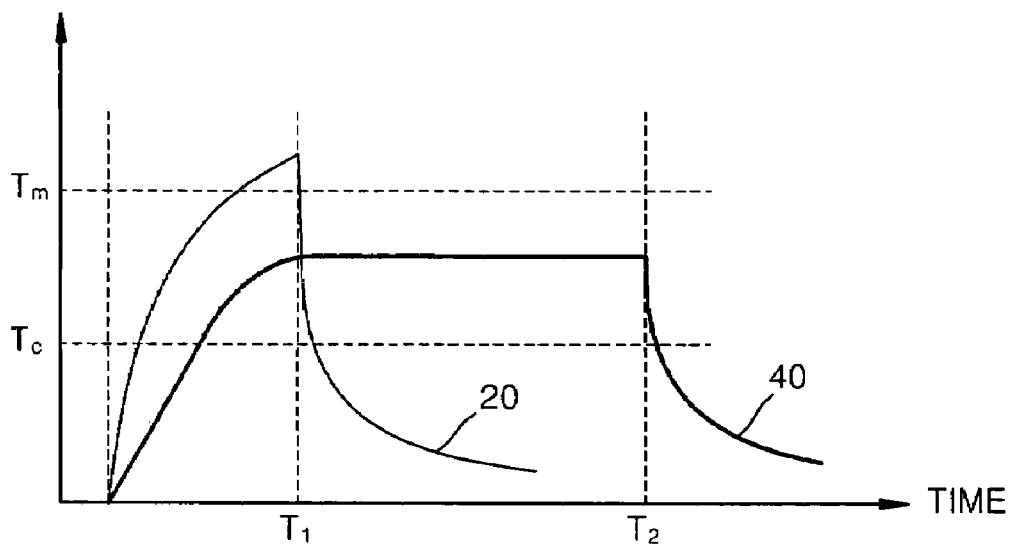
FIG. 3 is a graph of temperature versus time during an example heat treatment processes for changing the resistance of the phase change resistor in the phase change memory device of FIG. 2.

FIG. 3 is a graph of temperature versus time during an example heat treatment processes for changing the resistance of the phase change resistor 140. Referring to FIG. 3, when the phase change resistor 140 is heated for a time $T_1$ at a temperature greater than or equal to a melting point $T_m$ (of the phase change material comprising the phase change resistor), and cooled (e.g., rapidly cooled, 20), the phase change resistor 140 may enter an amorphous state.

When the phase change resistor 140 in the amorphous state is heated to a temperature lower than the melting point $T_m$, but higher than the crystallization temperature $T_c$, kept constant or substantially constant for a time $T_2$-$T_1$, and cooled (40), the phase change resistor 140 may crystallize or re-crystallize. The phase change resistor 140 may have a higher resistance in the amorphous state and a lower resistance in the crystalline state. The phase change resistor 140 may include a phase change material film, for example, a compound film having germanium (Ge), tellurium (Te), and antimony (Sb) (hereinafter, referred to as a GST film) or a chalcogenide film. Although any other suitable phase change material film may be used. Additional example phase change material films will be discussed in more detail below.

The crystalline state of the phase change resistor 140 may be changed by heating the phase change resistor 140, for example, resistively. An electric signal, for example, a pulse current or a pulse voltage, may be used to perform resistive heating. The state (e.g., crystalline state) of the phase change resistor 140 may be changed during a programming operation of the phase change memory device, and the resistance may be read during a reading operation.

For example, in a programming operation, according to an example embodiment, the resistance of the phase change resistor 140 may be changed to one of a plurality of stages (e.g., at least four stages) by applying an electric signal from the upper electrode 150 to the lower electrode 130 and/or from the lower electrode 130 to the upper electrode 150. In a reading operation, the programmed resistance of the phase change resistor 140 may be read by applying an electric signal between the upper electrode 150 and the lower electrode 130 in an arbitrary (e.g. any) direction. For the sake of clarity, a forward direction is defined herein as from the upper electrode 150 to the lower electrode 130, and a backward direction is defined herein as from the lower electrode 130 to the upper electrode 150. The forward and backward directions may be opposite.

Figure 4:
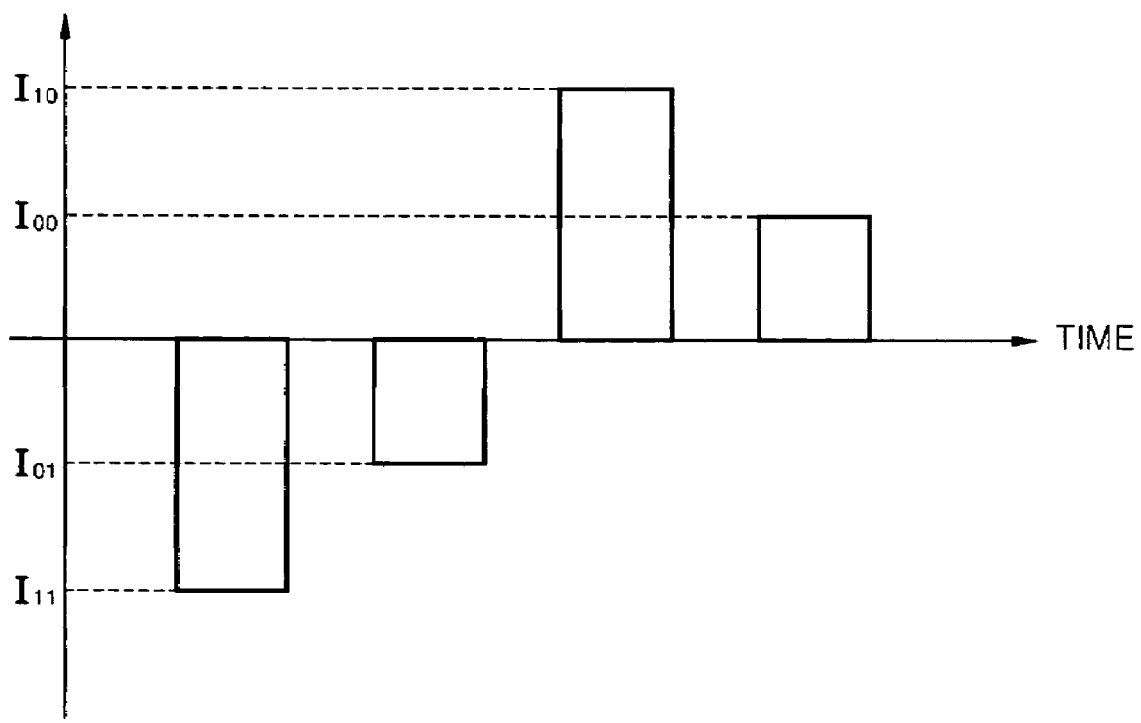
FIG. 4 is a graph of current versus time in a programming operation, according to an example embodiment of the present invention.

FIG. 4 is a graph of current versus time during a programming operation of an example phase change memory device of FIG. 2. Referring to FIG. 4, a plurality of pulse currents (e.g., four pulse currents) $I_{10}$, $I_{00}$, $I_{01}$, and $I_{11}$ may be used in the programming operation. A pair of positive pulse currents $I_{10}$ and $I_{00}$ may be defined as first and second forward directional pulse currents, respectively, and a pair of negative pulse currents $I_{01}$, and $I_{11}$ may be defined as first and second backward directional currents, respectively. The first and second forward directional pulse currents $I_{10}$ and $I_{00}$ and the first and second backward directional pulse currents $I_{10}$ and $I_{11}$ have opposite polarities. The first forward directional pulse current $I_{10}$ may have a larger magnitude (e.g., absolute magnitude) than the second forward directional pulse current $I_{00}$ and the first backward directional pulse current $I_{11}$ may have a larger magnitude (e.g., absolute magnitude) than the second backward directional pulse current $I_{01}$.

The first forward directional pulse current $I_{10}$ may transition the phase change resistor 140 to a forward directional reset state and the second forward directional pulse current $I_{00}$ may transition the phase change resistor 140 to a forward directional set state. The first backward directional pulse current $I_{11}$ may transition the phase change resistor 140 to a backward directional reset state and the second backward directional pulse current $I_{01}$ may transition the phase change resistor 140 to a backward directional set state. In at least one example embodiment, the first forward directional pulse current $I_{10}$ and the first backward directional pulse current $I_{11}$ may have the same or substantially the same magnitude (e.g., absolute magnitude), and the second forward directional pulse current $I_{00}$ and the second backward directional pulse current $I_{01}$ may have the same or substantially the same magnitude (e.g., absolute magnitude). However, example embodiments of the present invention need not be limited thereto.

Figure 5:
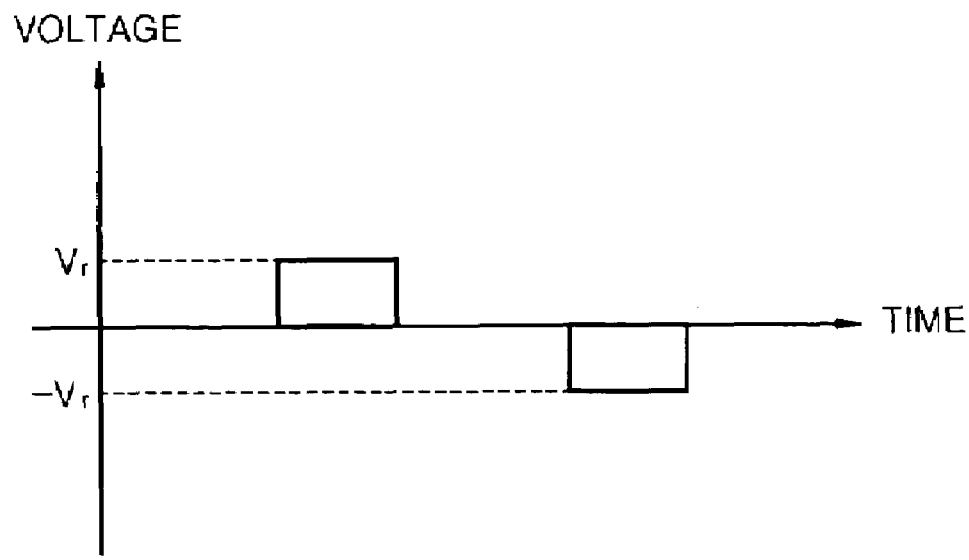
FIG. 5 is a graph of voltage versus time in a reading operation, according to an example embodiment of the present invention.

FIG. 5 is a graph of voltage versus time during an example reading operation in the phase change memory device of FIG. 2. Referring to FIG. 5, a pulse voltage in an arbitrary direction, for example, a forward directional pulsed voltage $V_r$ or a backward directional pulsed voltage $-V_r$ may be used in a reading operation, according to at least one example embodiment. The forward directional or backward directional pulsed voltage $V_r$ or $-V_r$ may have a magnitude in a desired or given range. The range of the magnitude of the directional pulse voltages $V_r$ and $-V_r$ may be such that the resistance of the phase change resistor 140 (see FIG. 2) remains unchanged or substantially unchanged. For example, in the desired range of the magnitude of the forward directional or backward directional pulsed voltage $V_r$ or $-V_r$, the crystalline state of the phase change resistor 140 may be unchanged or substantially unchanged due to heat produced. The forward directional or backward directional pulse voltage $V_r$ or $-V_r$ may result in a lower temperature than the crystallization temperature.

Figure 6:
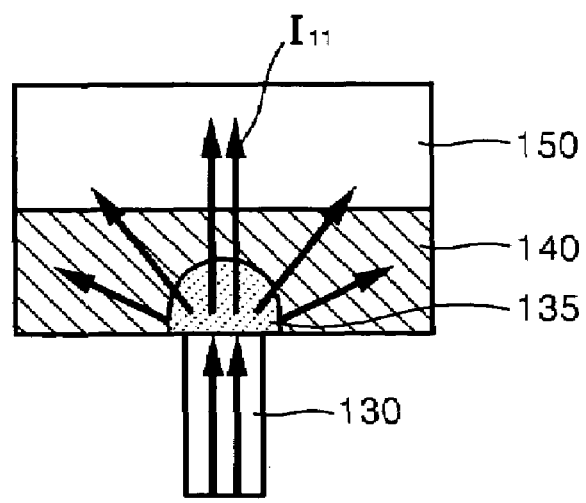
FIGS. 6 through 9 are cross-sectional views illustrating a programming operation, according to an example embodiment of the present invention.

FIGS. 6 through 9 are cross-sectional view illustrating a programming operation, according to an example embodiment. Referring to FIG. 6, the first backward directional pulse current $I_{11}$ may be supplied from the lower electrode 130 to the upper electrode 150 to heat the phase change resistor 140 to a higher temperature. The phase change resistor 140 may be heated resistively. The current may be concentrated in the phase change region 135 so that the phase change region 135 may be melted and cooled, thereby changing to an amorphous state. Accordingly, the phase change resistor 140 has a higher resistance and may be in the backward directional reset state.

Figure 7:
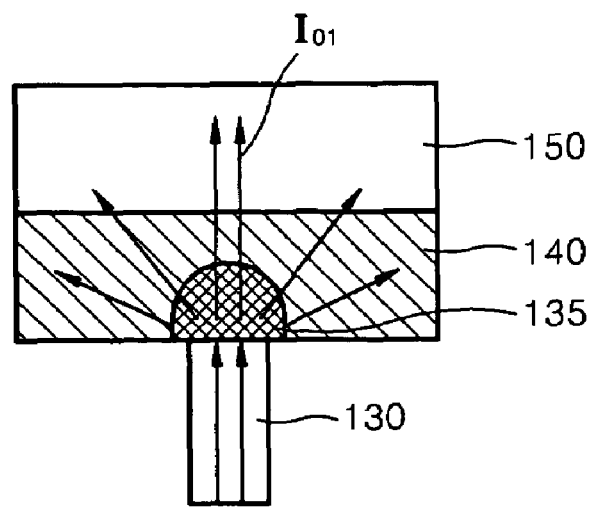

Referring to FIG. 7, the second backward directional pulse current $I_{01}$ may be supplied from the lower electrode 130 to the upper electrode 150 to heat the phase change resistor 140 in the amorphous state. The phase change resistor 140 may be heated resistively. The phase change region 135, in which the current may be concentrated, may be heated (e.g., locally) above the crystallization temperature and then cooled. As a result, the phase change region 135 may be changed from the amorphous state to a crystalline state. The phase change resistor 140 may have a lower resistance and may be in a backward directional set state.

Figure 8:
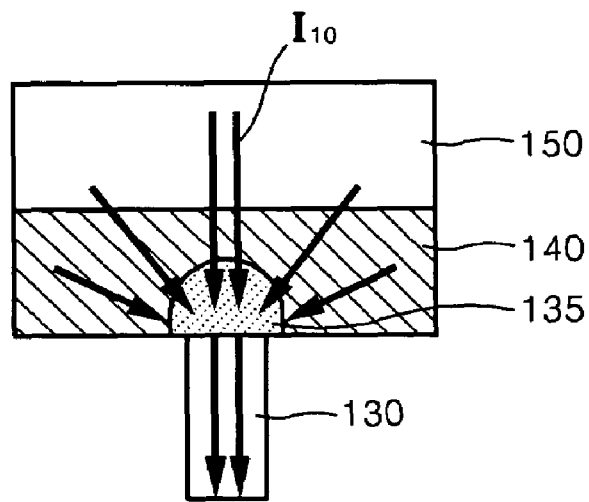

Referring to FIG. 8, the first forward directional pulse current $I_{10}$ may be supplied from the upper electrode 150 to the lower electrode 130 to heat the phase change resistor 140 to a higher temperature. As discussed above, the phase change resistor 140 may be heated resistively. The current may be concentrated in the phase change region 135 so that the phase change region 135 may be melted and cooled, thereby changing from the crystalline state to an amorphous state. As a result, the phase change resistor 140 may have a higher resistance and may be in the forward directional reset state.

Figure 9:
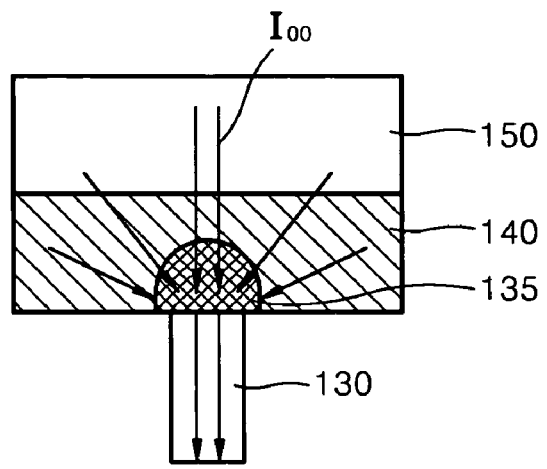

Referring to FIG. 9, the second forward directional pulse current $I_{00}$ may be supplied from the upper electrode 150 to the lower electrode 130 to heat the phase change resistor 140. The phase change resistor 140 may be heated resistively. The phase change region 135, in which the current may be concentrated, may be heated (e.g., locally) above the crystallization temperature and then cooled. Accordingly, the phase change region 135 may be changed from the amorphous state to a crystalline state. In this example, the phase change resistor 140 has a lower resistance and may be in the forward directional set state.

The phase change resistor 140 may be changed (e.g., sequentially changed) from the backward directional reset state to the backward directional set state, from the backward directional set state to the forward directional reset state, and from the forward directional reset state to the forward directional set state to change the resistance of the phase change resistor 140, for example, progressively. A programming operation, according to at least some example embodiments, may be used to store 2-bit data. The four states may be obtained (e.g., reliably obtained) by applying electric signals, for example, pulse currents and/or pulse voltages in the programming operation while changing the direction of the electric signals. Accordingly, a programming operation, according to at least some example embodiments, may be more reliable and/or more easily commercialized than the related art methods in which the amplitudes of pulse signals are controlled.

Figure 10:
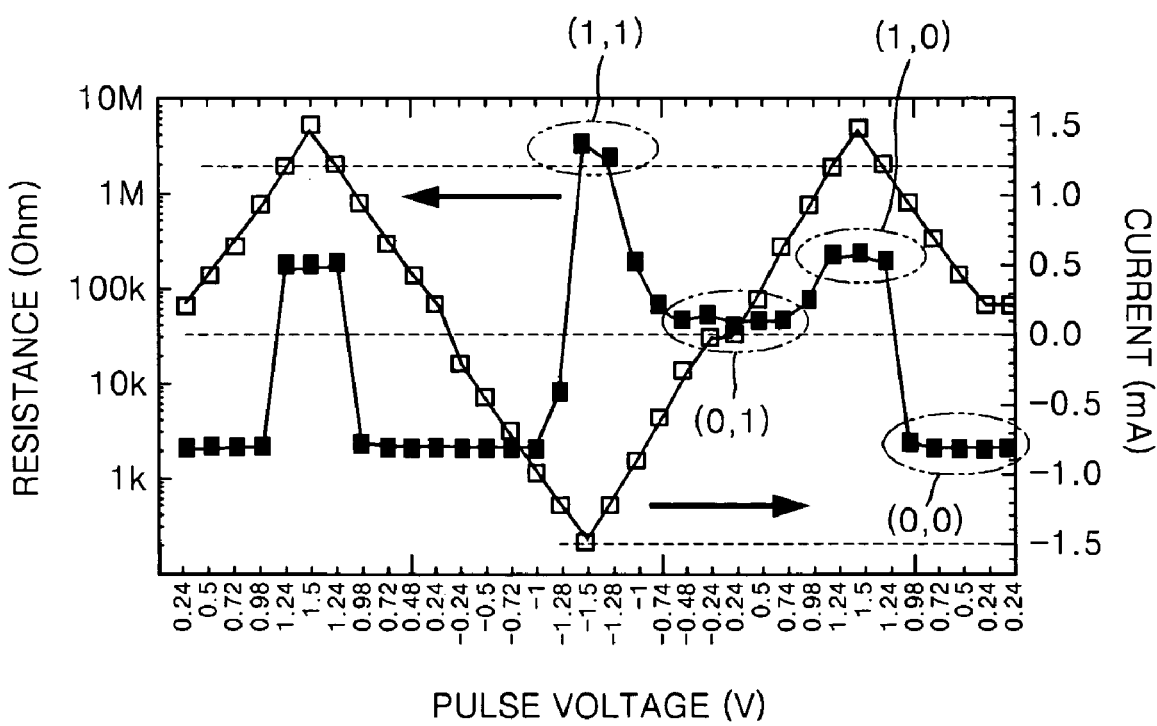
FIG. 10 is a graph illustrating current and resistance characteristics according to pulse voltages in an example operation of the phase change memory device of FIG. 2.

The resistances of the phase change resistor 140 in the above-described four states may be described by the following example experiment. FIG. 10 is a graph illustrating current and resistance characteristics according to pulse voltages in an experiment of an operation of the phase change memory device of FIG. 2. The upper and lower electrodes 150 and 130 included TiN films, and the phase change resistor 140 included a GST film. The contact portion of the lower electrode 130 with the phase change resistor 140 was a circle having a diameter of about 50 nm.

Referring to FIG. 10, when a pulse voltage is applied in a forward and/or a backward direction, the resistance of the phase change resistor 140 gradually changed. In this example, (1, 1) denotes a backward directional reset state, (0, 1) denotes a backward directional set state, (1, 0) denotes a forward directional reset state, and (0, 0) denotes a forward directional set state. The resistance of the phase change resistor 140 may be the highest in the backward directional reset state (1, 1), and may gradually decrease in order of the forward directional reset state (1, 0), the backward directional set state (0, 1) and the forward directional set state (0, 0). However, the resistance of phase change resistors, according to example embodiments of the present invention, in each of these states may be different, and not limited to the above described order.

The phase change region 135 of the phase change resistor 140 was in an amorphous state in the forward directional reset state (1, 0) and the backward directional reset state (1, 1), and a crystalline state in the forward directional set state (0, 0) and the backward directional set state (0, 1). However, the resistance difference of the phase change resistor 140 in the forward and backward directional programming operations may depend on the degree of crystallization of the phase change region 135 and/or the shape of the amorphous phase region 135.

The right vertical axis indicates a current flowing through the phase change resistor 140 when a pulse voltage is applied. However, the resistance of the phase change resistor 140 may be read during the reading operation when the pulse voltage is not supplied. When the pulse voltage is applied, the phase change region 135 of the phase change resistor 140 may melt dr crystallize, and the resistance may not change (e.g., significantly change) in such dynamic states. As a result, the slope of the current may not change, for example, significantly.

The four states, that is (1, 1), (0, 1), (1, 0), and (0, 0), may be representative of the four state data or 2-bit data. The resistance of the phase change resistor 140 in the four states may be read more easily using a reading operation similar to related art methods.

Although example methods discussed herein have been described with respect changing resistance of a phase change resistor in a phase change memory device by varying the direction of an electric signal, such as, current and/or voltage through the phase change resistor, example methods for changing resistance by varying the direction an electric signal flows through a resistor are equally applicable and/or may be implemented in any apparatus and/or device (e.g., any semiconductor device, semiconductor memory device, etc.) in which varying the direction of an electric signal, such as, current and/or voltage may be used to vary resistance, program and/or perform any desired operation.

Although example embodiments have been described with regard to a phase change resistor having two contact areas, each of which is a different size, any suitable methodology for enabling a resistance of a phase change resistor, or any other resistor, to be changed by varying the direction that an electric signal (e.g., voltage and/or current) flows through the resistor may be used.

Programming methods, according to an example embodiment of the present invention, may further employ a related art multi level cell (MLC) method in conjunction with the above-described forward and backward directional operating method. Accordingly, programming methods, according to another example embodiment of the present invention, may be applied to multi-bit data greater than 2-bit data processes (e.g., an "N-bit data process"). According to another example embodiment of the present invention, a phase change memory device may store a plurality of bits, for example, at least 2 bits.

Example embodiments of the present invention have been described with regard to a phase change material film, for example, a compound film having germanium (Ge), tellurium (Te), and antimony (Sb) (hereinafter, referred to as a GST film) or a chalcogenide film. Alternatively, however, the phase change material film may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material film is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change material film may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase change material film may be a chemical compound including one or more elements selected from the group consisting of S, Se, Te, As, Sb, Ge, Sn, In and Ag.

While an example embodiment of the present invention may particularly shown and described with reference to example embodiments thereof, it will be understood by those of ordinary skill in the art that various changes in form and details may be made therein without departing from the spirit and scope of the present invention as defined by the following claims.

What is claimed is:

1. A method for operating a phase change memory device, the method comprising:

programming the phase change memory device by changing a resistance of a phase change resistor to at least one of a plurality of states by applying an electric signal in a first direction between a first electrode and a second electrode, and applying an electric signal in a second direction between the first electrode and the second electrode, the first direction and the second direction being different; and reading the programmed resistance of the phase change resistor by applying an electric signal between the first electrode and the second electrode in an arbitrary direction.

2. The method of claim 1, wherein the first direction is a direction from the first electrode to the second electrode and the second direction is a direction from the second electrode to the first electrode.

3. The method of claim 1, wherein the plurality of states includes at least four states.

4. The method of claim 1, wherein the programming further includes, applying an electric signal in the first direction so that the resistance of the phase change resistor changes to a first set state or a first reset state, and applying an electric signal in the second direction so that the resistance of the phase change resistor changes to a second set state or a second reset state.

5. The method of claim 4, wherein a magnitude of the electric signal applied to change the resistance of the phase change resistor to the first set state is equal to a magnitude of the electric signal applied to change the resistance of the phase change resistor to the second set state.

6. The method of claim 4, a magnitude of the electric signal applied to change the resistance of the phase change resistor to the first reset state is equal to a magnitude of the electric signal applied to change the resistance of the phase change resistor to the second reset state.

7. The method of claim 1, wherein the electric signal applied in the first direction and the electric signal applied in the second direction have opposite polarities.

8. The method of claim 1, wherein the first electrode includes a first contact area contacting the phase change resistor, and the second electrode includes a second contact area for contacting the phase change resistor, and the first contact area and the second contact areas are different.

9. The method of claim 1, wherein the first electrode includes a first contact area contacting the phase change resistor, and the second electrode includes a second contact area for contacting the phase change resistor, the first contact area and the second contact areas contacting opposite ends of the phase change resistor.

10. The method of claim 8, wherein the contact area of the first electrode is larger than the contact area of the second electrode.

11. The method of claim 1, wherein the plurality of states includes a first set state, a second set state, a first reset state and a second reset state, and a resistance of the phase change resistor is lowest in the first set state, second lowest in the second set state, third lowest in the first reset state, and highest in the second reset state.

12. The method of claim 1, wherein the electric signal in the programming operation is a pulse current or a pulse voltage.

13. The method of claim 1, wherein the electric signal in the reading operation is a pulse voltage.

14. The method of claim 13, wherein the pulse voltage has a magnitude in a range in which the resistance of the phase change resistor is unchanged.

15. A phase change memory device comprising:
a phase change resistor having a variable resistance and being formed between a first electrode and a second electrode, wherein
the phase change memory device is configured to be programmed by setting the variable resistance to one of a plurality of states by varying a direction in which an electric signal flows through the phase change resistor.

16. The phase change memory device of claim 15, wherein the phase change memory device is further configured to read the programmed resistance of the phase change resistor by applying an electric signal between the first electrode and the second electrode in an arbitrary direction.

17. The phase change memory device of claim 15, wherein the first electrode and the second electrode are different.

18. The phase change memory device of claim 15, wherein the phase change resistor includes a first contact area contacting the first electrode and a second contact area contacting the second electrode, wherein the first contact area is smaller than the second contact area.

19. A method for operating a phase change memory device including a phase change resistor, the method comprising:
programming the phase change memory device by changing a resistance of the phase change resistor to one of a plurality of states by varying a direction in which an electric signal flows through the phase change resistor.

20. The method of claim 19, further including,
reading the programmed resistance of the phase change resistor by applying an electric signal to the phase change resistor in an arbitrary direction.

* * * * *